US009523756B2

(12) United States Patent
Sun

(10) Patent No.: US 9,523,756 B2
(45) Date of Patent: Dec. 20, 2016

(54) SYSTEMS AND METHODS OF INPUT POWER AND CURRENT MEASUREMENT

(71) Applicant: Texas Instruments Incorporated, Dallas, TX (US)

(72) Inventor: Bosheng Sun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 692 days.

(21) Appl. No.: 13/915,777

(22) Filed: Jun. 12, 2013

(65) Prior Publication Data

US 2014/0052394 A1    Feb. 20, 2014

Related U.S. Application Data

(60) Provisional application No. 61/691,153, filed on Aug. 20, 2012.

(51) Int. Cl.
*G01R 35/00* (2006.01)
*G01R 35/04* (2006.01)
*G01R 21/133* (2006.01)

(52) U.S. Cl.
CPC ........... *G01R 35/005* (2013.01); *G01R 21/133* (2013.01); *G01R 35/04* (2013.01)

(58) Field of Classification Search
CPC ..... G01R 21/133; G01R 35/005; G01R 35/04; H02M 1/4225; H02M 1/44; H05B 33/08; H05B 33/0815; H05B 33/083; H05B 33/0845; H05B 37/0209; Y02B 70/126
USPC ...... 702/61, 64, 66, 106, 107; 323/211, 285; 361/86; 363/16, 46, 89
See application file for complete search history.

(56) References Cited

U.S. PATENT DOCUMENTS

| 5,600,549 | A | | 2/1997 | Cross |
| 5,777,866 | A | * | 7/1998 | Jacobs ............... H02M 1/4225 323/222 |
| 5,959,849 | A | | 9/1999 | Batarseh et al. |
| 7,015,682 | B2 | | 3/2006 | Santin et al. |
| 2002/0180408 | A1 | | 12/2002 | McDaniel et al. |
| 2008/0285318 | A1 | | 11/2008 | Tan et al. |
| 2009/0316454 | A1 | * | 12/2009 | Colbeck .............. H02M 1/4225 363/89 |

OTHER PUBLICATIONS

PCT Search Report mailed Nov. 27, 2013.
Texas Instruments Data Manual for Part No. UCD3138, Literature No. SLUSAP2F, Mar. 2012, Revised Nov. 2012.

* cited by examiner

*Primary Examiner* — John H Le
(74) *Attorney, Agent, or Firm* — William B. Kempler; Chares A. Brill; Frank D. Cimino

(57) ABSTRACT

As disclosed herein, a PFC control device, may be used for power factor correction and for input power and current measurement simultaneously. To determine the input power, input voltage and input current are determined. These measurements may be performed using a current sensor and a voltage sensor, for example. In an example embodiment of the systems and methods of input power and current measurement disclosed herein, the current is measured after an electromagnetic interference (EMI) filter. The input voltage and input current should be sampled substantially simultaneously. The measured input current is adjusted due to a phase shift introduced in the current sense circuit. The input voltage and input current should be sampled substantially simultaneously. The input power is determined using the PFC input voltage and the adjusted input current. The total input current is determined using the PFC input current and the EMI filter reactive current.

17 Claims, 3 Drawing Sheets

SYSTEMS AND METHODS OF INPUT POWER AND CURRENT MEASUREMENT

CROSS-REFERENCE TO RELATED APPLICATION

This application claims benefit to U.S. provisional patent application Ser. No. 61/691,153, filed on Aug. 20, 2012, which is incorporated by reference herein.

TECHNICAL FIELD

The present disclosure is generally related to electronics and, more particularly, is related to input power and current measurement.

BACKGROUND

Real-time energy consumption measurement, including input power and RMS current (Irms) measurement, is becoming more and more important in today's "green world" environment. These measurements may be used to adjust power delivery and optimize energy usage. Moreover, they encourage off-peak period energy consumption and efficient energy resource management. Traditionally, input power and current are measured by a dedicated power metering chip. While the power metering chip has provided acceptable results, it adds significant cost and design effort. There are heretofore unaddressed needs with previous solutions.

SUMMARY

Example embodiments of the present disclosure provide systems of input power and current measurement. Briefly described, in architecture, one example embodiment of the system, among others, can be implemented as follows: a power factor correction (PFC) control device comprising: a plurality of analog to digital converter (ADC) inputs and a PWM output, a first at least one of the plurality of ADC inputs configured for sensing an input voltage, a second at least one of the plurality of ADC inputs configured for sensing an input current, the PWM output configured to control an output voltage of a PFC circuit; an input voltage signal conditioning module configured to receive an input voltage and adjust the input voltage range for the measurement range of the first of the plurality of ADC inputs; and a current sense signal conditioning module configured to sense an input current of the PFC control circuit and adjust a signal representing the sensed input current to fit within a measurement range of the second at least one of the plurality of ADC inputs, the PFC control device configured to adjust the determined input current to compensate for reactive current in an electromagnetic filter to determine a total input current and to compensate for a phase shift introduced by the current sense conditioning circuit.

Embodiments of the present disclosure can also be viewed as providing methods of input power and current measurement. In this regard, one embodiment of such a method, among others, can be broadly summarized by the following steps: determining power factor correction (PFC) input current with inputs of a PFC control device; determining PFC input voltage with inputs of a PFC control device; correlating the PFC input voltage and the PFC input current such that the PFC input voltage and the PFC input current are sampled substantially simultaneously; adjusting the determined PFC input current value to compensate for a phase shift in a current sense circuit to determine an adjusted input current; calculating the input power using the correlated PFC input voltage and the adjusted input current, and adjusting the determined input current to compensate for reactive current in an electromagnetic interference (EMI) filter to determine a total input current.

DETAILED DESCRIPTION

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Disclosed herein are systems and methods of input power and current measurement. Input power and current measurement may be used, for example, by servers to identify power costs. In many server power circuits, a power factor control (PFC) device is utilized to enable any electrical load to appear like a resistor to the voltage source that powers it. PFC may be government mandated (as in Europe, Japan, etc.) or a guideline from public interest entities (such as Energy Star in the U.S.). As disclosed herein, the PFC control device, may be used as both for power factor correction and for input power and current measurement.

The PFC device on the front end of a power supply control circuit collects an alternating current (AC) input signal and adjusts the current signal to follow the phase of the voltage signal. The voltage signal is generally sinusoidal; so the current signal is adjusted to follow the voltage signal with a sinusoidal signal and in-phase. To control the PFC, the input voltage and the input current are measured so that the input current can be appropriately adjusted.

To determine the input power, input voltage and input current are determined. These measurements may be performed using a current sensor and a voltage sensor, for example. In an example embodiment of the systems and methods of input power and current measurement disclosed herein, the current is measured after an electromagnetic interference (EMI) filter. However, the actual input current includes the EMI filter reactive current and the current measured after the EMI filter. A formula may be utilized to calculate the EMI filter reactive current. The EMI filter may be simplified as a single capacitor for this calculation. The input voltage and the total capacitance of the EMI filter may be used to determine the EMI filter reactive current.

Figure 1:
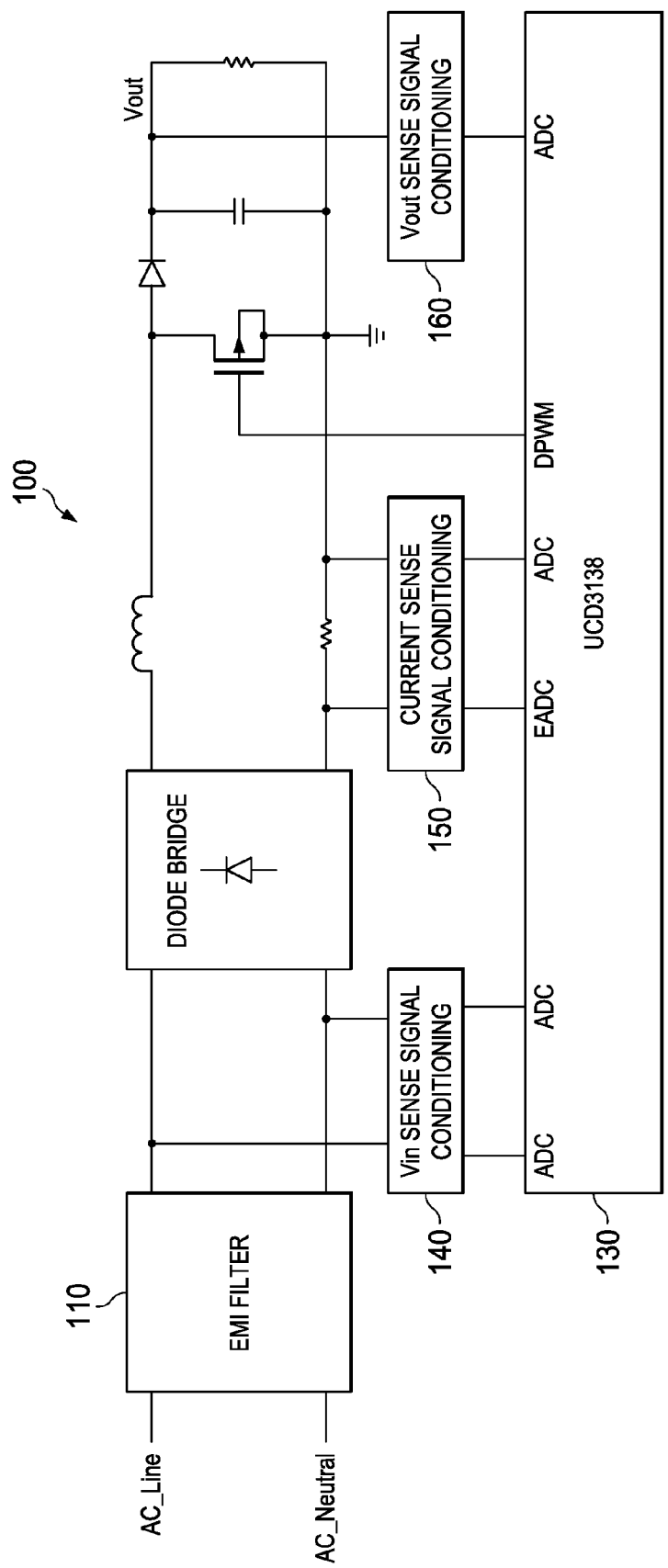
FIG. 1 is a circuit diagram of an example embodiment of a system of input power and current measurement.

FIG. 1 provides circuit 100, an example embodiment of a system of input power and measurements using an example PFC control device (UCD3138). Circuit 100 uses an example conventional PFC application. The input line and neutral voltage are both sensed through conditioning block 140 and subsequently sampled by separate analog to digital converter (ADC) inputs. These measurements may be "rectified" by firmware for both the control and monitoring functions. Output voltage sensed through conditioning block 160 by another ADC may be used for voltage loop control. The current signal may be sensed by a current shunt and amplified and filtered in signal conditioning block 150, and then connected to an error ADC (EADC) for current loop control. In addition, the current signal may be further filtered and connected to an ADC for input current measurement. The example configuration of FIG. 1 uses almost the same existing PFC circuit, adding a low pass filter for ADC current sensing. Example embodiments greatly reduce the cost and design effort for input power and current measurement.

The measured current sensed at the ADC of the PFC control device may not represent the total input current since the contribution of the capacitance in the EMI input filter is not included. The difference between measured current and actual input current increases at high line and light load and may be included for accurate input current reporting.

Figure 2:
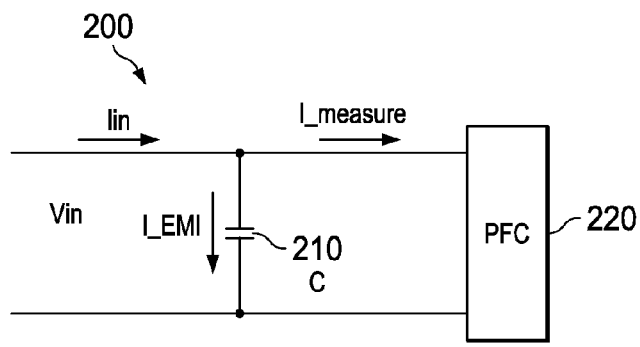
FIG. 2 is a circuit diagram of an example embodiment of a simplified circuit of the EMI filter of FIG. 1.

FIG. 2 provides simplified EMI filter circuit 200. In circuit 200, the inductors are removed and the total capacitance is replaced with a single capacitor C. I_EMI represents the RMS current of EMI capacitor 210. I_measure represents the input RMS current measured by PFC control device 220. Iin represents the total input RMS current. In an example implementation, the equivalent capacitance of this EMI filter is 3 µF. Consider a case in which Vin=265V, AC frequency=65 Hz, and a light load with I_measure=0.25 A. An input current measurement accuracy may be required to be less than 0.05 A at this power level. The reactive current produced by the EMI filter may be calculated by:

$$I_{EMI} = \frac{V_{in}}{1/2\pi fC} = 265 * 2\pi * 65 * 3 * 10^{-6} = 0.325 \quad (1)$$

The I_EMI is a reactive current and leads the measured current I_measure by 90 degree, therefore:

$$I_{in} = \sqrt{I_{EMI}^2 + I\_measure^2} = \sqrt{0.325^2 + 0.25^2} = 0.41 \quad (2)$$

Thus the difference between the measured input current and actual total input current will be 0.41 A−0.25 A=0.16 A, which may be much larger than a typical required accuracy of 0.05 A at this power level. Therefore, the reactive current generated by the EMI filter may be included in the total reported input current.

Figure 3:
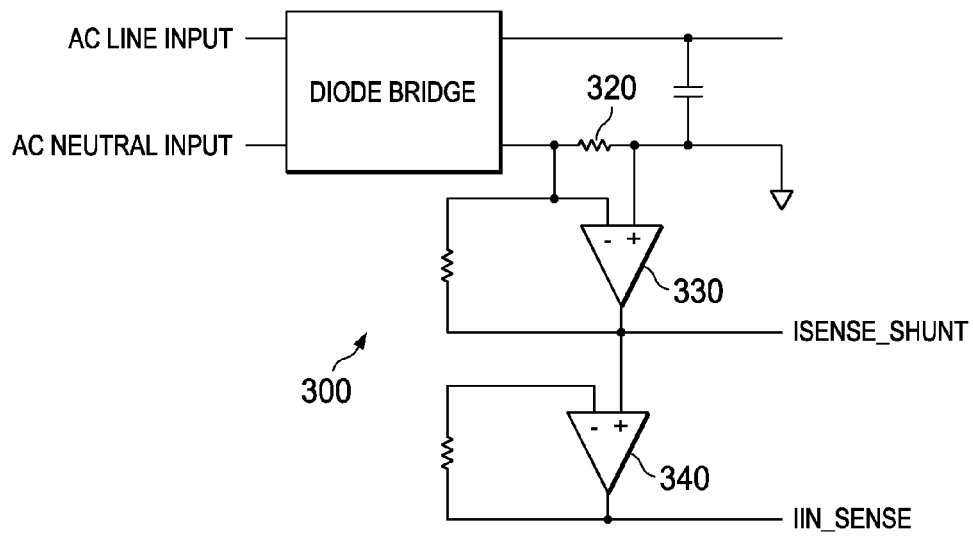
FIG. 3 is a circuit diagram of an example embodiment of the current measurement circuit of FIG. 1.

FIG. 3 provides current feedback and measurement circuit 300. The voltage drop on resistor 320 is amplified and filtered, its output "ISENSE_SHUNT" will go to a current loop for PFC input current regulation. "ISENSE_SHUNT" is adjusted so that the voltage swing fits within the measurement range of the EADC.

Due to the high bandwidth of a typical current sense filter, "ISENSE_SHUNT" may have a high frequency ripple, which may affect the input current measurement accuracy. Also, the ADC may have a higher measurement range than the EADC. To remove the high frequency ripple and fully use the ADC measurement range in an example embodiment, another op-amp and a low pass filter may be used to change "ISENSE_SHUNT" to "IIN_SENSE". After this signal conditioning, "IIN_SENSE" will be a smooth waveform and accommodate the ADC measurement range. It may then be measured by the ADC, which may be, for example, a 12-bit ADC.

The current sense signal may then be measured and reported in digitized ADC counts. To get the real current value in Amperes, the ADC counts may be translated back to current in Amperes. The relation between ADC counts and Ampere may be derived from the circuit. However, the component tolerances may make the measurement accuracy unacceptable. Therefore, a calibration may be implemented to determine the relationship between digitized ADC counts and Amperes.

Given the provided current measurement circuits, at any moment:

$$i = k_i C_i - m_i \quad (3)$$

where i is the input current through current shunt (in mA), $k_i$ is the current sense gain, $C_i$ is the ADC conversion output (in counts), and $m_i$ is current sense offset. For constant DC input, the average current value equals the instantaneous value, so equation (3) is still valid:

$$I_{DC} = k_i C_i - m_i \quad (4)$$

Equation (4) allows the use of a DC source to calibrate the current measurement. In an example embodiment, a constant DC power is applied on the PFC input; then a 25% load and a 75% load are applied. The average input current value is compared to the ADC conversion output at each of the two load values.

$$25\% \text{ load: } I_{DC1} = k_i C_{i1} - m_i \quad (5)$$

$$75\% \text{ load: } I_{DC2} = k_i C_{i2} - m_i \quad (6)$$

The current sense gain $k_i$ and offset $m_i$ may be calculated from (5) and (6):

$$k_i = \frac{I_{DC2} - I_{DC1}}{C_{i2} - C_{i1}} \quad (7)$$

$$m_i = \frac{C_{i1} I_{DC2} - C_{i2} I_{DC1}}{C_{i2} - C_{i1}} \quad (8)$$

The calibrated $k_i$ and $m_i$ may be stored in data flash of the PFC control device, for example, for input power and current measurement. However, the calculated $k_i$ and $m_i$ may be decimal values and may be less than 1, and the PFC control device may use fixed point mathematical calculations. To reduce the rounding errors and maintain enough accuracy in the calculations, the small decimal values may be multiplied by $2^N$ and then rounded to the closest integer. For example, if the current sense gain and offset for a PFC are calculated as $k_i=1.59$ and $m_i=229.04$, $k_i$ may be multiplied by $2^8$ and rounded to 407, and $m_i$ may be multiplied by $2^0$ and rounded to 229. The following items may then be defined as programmed in C:

define IIN_SLOPE (407)
define IIN_SLOPE_SHIFT (8)
define IIN_OFFSET (229)
define IIN_OFFSET_SHIFT (0).

When the input power and current are calculated, if $k_i$ and $m_i$ are multiplied instead of using $k_i$ and $m_i$ directly, IIN_SLOPE and IIN_OFFSET are used to perform the multiplication. Then the result is right shifted by IIN_SLOPE_SHIFT and IIN_OFFSET_SHIFT. For example, instead of calculating:

$$y = k_i x + m_i z,$$

It will be calculated as:

$$y = ((IIN\_SLOPE * x) >> IIN\_SLOPE\_SHIFT) + ((IIN\_OFFSET * z) >> IIN\_OFFSET\_SHIFT)$$

Figure 4:
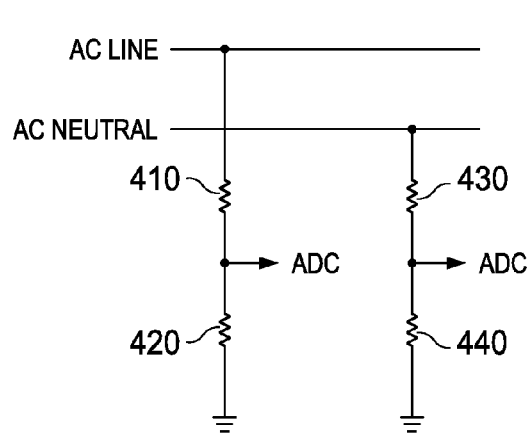
FIG. 4 is a circuit diagram of an example embodiment of the input voltage sensing circuit of FIG. 1.

In an example embodiment, the voltage sense circuit is a voltage divider as provided in circuit 400 of FIG. 4. The AC input line voltage is divided down by resistors 410 and 420, and the AC neutral voltage is divided down by resistors 430 and 440. At any moment:

$$v = k_v C_v - m_v \quad (9)$$

where v is the input voltage (in V), $k_v$ is the voltage sense gain, $C_v$ is the ADC conversion output (in counts), and $m_v$ is the voltage sense offset. $k_v$ and $m_v$ may be calibrated through in a similar way as the input current was calibrated. However, due to the simplicity of the circuit and saving the cost of calibration, it may be sufficient to calculate $k_v$ and $m_v$ from the schematic. The accuracy of the resistance used for the voltage divider will affect the measurement accuracy. In an example embodiment, low tolerance resistors, for example 0.1% tolerance, are used as the voltage divider to reduce the error and forego the calibration steps.

As shown in FIG. 4, the input voltage is attenuated by the voltage divider. Then the attenuated signal goes to an ADC (for example, a 12 bit ADC) and is converted to a digital signal. In an example implementation, the reference of the ADC is 2.5V. In this case, $$C_v = \frac{vR_2}{2.5(R_1 + R_2)} * 4096 \quad (10)$$

Solve v from above:

$$v = \frac{2.5(R_1 + R_2)}{4096 R_2} C_v \quad (11)$$

Therefore $$k_v = \frac{2.5(R_1 + R_2)}{4096 R_2} \quad (12)$$

$$m_v = 0 \quad (13)$$

As with the input current measurement, the voltage sense gain and offset may be multiplied by $2^N$ and then rounded to the closest integer to reduce the calculation error. For example, a circuit with $k_v = 0.09623$ and $m_v = 0$ may be defined as programmed in C:
define VIN_SLOPE (197)
define VIN_SLOPE_SHIFT (11)
define VIN_OFFSET (0)
define VIN_OFFSET_SHIFT (0).
The voltage sense gain and offset will be:

$$k_v = VIN\_SLOPE >> VIN\_SLOPE\_SHIFT$$

$$m_v = VIN\_OFFSET >> VIN\_OFFSET\_SHIFT$$

When the input power is calculated, if $k_v$ and $m_v$ are used being multiplied, instead of using $k_v$ and $m_v$ directly, VIN_SLOPE and VIN_OFFSET are used to perform the multiplication first, and then the result is right shifted by VIN_SLOPE_SHIFT and VIN_OFFSET_SHIFT.

Real input power may be defined as:

$$P = \frac{1}{T} \int_0^T v(t) i(t) dt \quad (14)$$

In discrete format:

$$P = \frac{\sum (v(n) i(n))}{N} \quad (15)$$

Equation (15) uses Vin and Iin sampled substantially simultaneously. Vin and Iin may be sampled by two different ADC channels with dual sample and hold functions. The dual sample and hold functions allows these two channels to be sampled simultaneously so that the input power calculation is accurate.

Due to the low pass filter in current sense circuit, the measured current signal is delayed and out of phase with actual current. The IIN_SENSE signal from the low pass filter has a phase delay from the actual current signal. A simple way to compensate for this is to delay the Vin sense signal by the amount of the phase delay. Then the delayed Vin signal may be used to calculate the input power. If, for example, Vin is measured every 20 μs and the phase delay is 220 μs, the Vin sense signal is delayed by 220/20, or 11 times. Thus a delay pointer may be defined in firmware as: iv.ipm_buff_delay=11.

In an example implementation, the ADC sampled Vin signal values is stored in a circulated data array, and the delay is implemented by the following code in firmware:
iv.cir_buff[iv.cir_buff_ptr]=iv.vin_raw;
iv.ipm_pointer=(iv.cir_buff_ptr−iv.ipm_buff_delay) & 0x3f;
iv.cir_buff_ptr=(iv.cir_buff_ptr+1) & 0x3f;
iv.vin=iv.cir_buff[iv.ipm_pointer];
Equation (15) may be rewritten as:

$$P = \frac{\sum (k_v C_v(n) - m_v)(k_i C_i(n) - m_i)}{N} \quad (16)$$

$$= \frac{k_v k_i \sum C_v(n) C_i(n)}{N} - \frac{k_v m_i \sum C_v(n)}{N} -$$

$$\frac{k_i m_v \sum C_i(n)}{N} + m_v m_i$$

In an example implementation, Vin and Iin are measured by the ADC every 20 μs in an interrupt loop. Since the interrupt loop may be used for PFC loop control, to save CPU calculation time and prevent the interrupt loop from overflow, only $C_v(n) C_i(n)$ is calculated in the interrupt loop, and $$\frac{\sum C_v(n)}{N}, \frac{\sum C_v(n) C_i(n)}{N}, \text{ and } \frac{\sum C_i(n)}{N}$$

may be replaced by IIR filters in firmware. The final input real power calculation may be performed in a background loop.

In calculating the reactive current of the EMI capacitor, the input voltage frequency is first determined. In an example embodiment, the AC line and neutral voltages are sensed by 2 ADC channels, and then rectified in firmware. The zero crossing may be found by comparing the ADC results. Since the input voltage is sampled at a fixed rate, the AC frequency may be determined by counting the number of samples between 2 consecutive zero crossing points. Once input voltage frequency is determined, the reactive current of the EMI capacitor may be calculated as:

$$I_{EMI} = 2\pi f C V_{in\_rms} \qquad (17)$$

$$= 2\pi f C \sqrt{\frac{k_v^2 \sum C_v^2(n)}{N} - \frac{2k_v m_v \sum C_v(n)}{N} + m_v^2}$$

In the example implementation, the voltage is measured at every 20 μs in the interrupt loop. To save CPU calculation time and prevent the interrupt loop from overflow, $C_v^2(n)$ may be calculated in the interrupt loop, and $$\frac{\sum C_v^2(n)}{N} \text{ and } \frac{\sum C_v(n)}{N}$$

may be replaced by IIR filters in firmware. Then the reactive current through the EMI capacitor may be performed in a background loop.

The RMS current value may be calculated as:

$$I_{rms} = \sqrt{\frac{1}{T} \int_0^T i(t)^2 dt} \qquad (18)$$

In discrete format:

$$I_{rms} = \sqrt{\frac{\sum i_n(n)^2}{N}} \qquad (20)$$

$$= \sqrt{\frac{k_i^2 \sum C_i^2(n)}{N} - \frac{2k_i m_i \sum C_i(n)}{N} + m_i^2}$$

In the example implementation, the current may be measured at every 20 μs in an interrupt loop. To save CPU calculation time and prevent the interrupt loop from overflow, $C_i^2(n)$ may be calculated in an interrupt loop, and $$\frac{\sum C_i^2(n)}{N} \text{ and } \frac{\sum C_i(n)}{N}$$

may be replaced by IIR filters in firmware.

The EMI filter reactive current compensation may then be factored in:

$$I_{in\_rms} = \sqrt{I_{EMI}^2 + I_{rms}^2} \qquad (20)$$

The RMS input current may then be calculated in a background loop.

Figure 5:
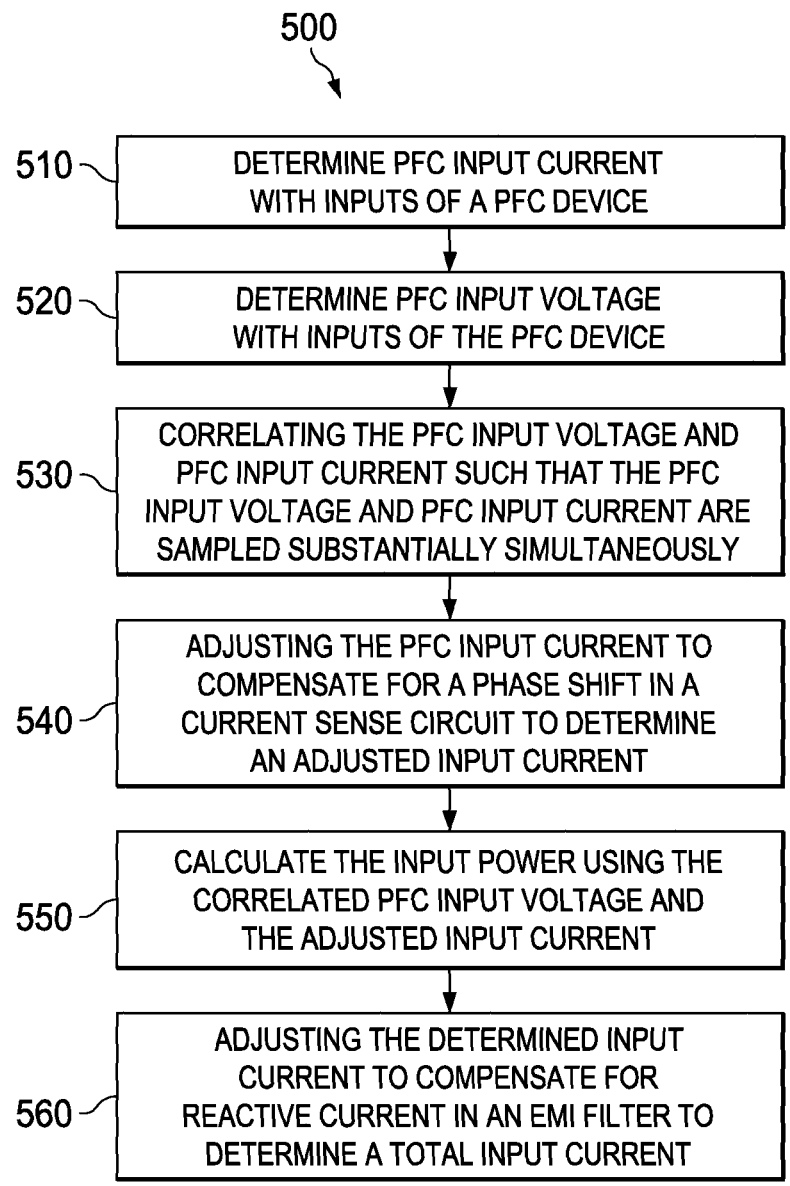
FIG. 5 is a flow diagram of an example embodiment of a method of input power and current measurement.

FIG. 5 provides flowchart 500 of an example embodiment of a method of input power and current measurement. In block 510, the PFC input current is determined with inputs of a PFC device. In block 520, the PFC input voltage is determined with the inputs of the PFC device. In block 530, the PFC input voltage and the PFC input current are correlated such that the PFC input voltage and the PFC input current are sampled substantially simultaneously. In block 540, the PFC input current is adjusted to compensate for a phase shift in a current sense circuit to determine an adjusted input current. In block 550, the input power is calculated using the correlated PFC input voltage and the adjusted input current. In block 560, the PFC input current is adjusted to compensate for the reactive current in an EMI filter to determine a total input current.

The flow chart of FIG. 5 shows the architecture, functionality, and operation of a possible implementation of the input power and current measurement software. In this regard, each block may represent a module, segment, or portion of code, which comprises one or more executable instructions for implementing the specified logical function(s). It should also be noted that in some alternative implementations, the functions noted in the blocks may occur out of the order noted in FIG. 5. For example, two blocks shown in succession in FIG. 5 may in fact be executed substantially concurrently or the blocks may sometimes be executed in the reverse order, depending upon the functionality involved. Any process descriptions or blocks in flow charts should be understood as representing modules, segments, or portions of code which include one or more executable instructions for implementing specific logical functions or steps in the process, and alternate implementations are included within the scope of the example embodiments in which functions may be executed out of order from that shown or discussed, including substantially concurrently or in reverse order, depending on the functionality involved. In addition, the process descriptions or blocks in flow charts should be understood as representing decisions made by a hardware structure such as a state machine.

The logic of the example embodiment(s) can be implemented in hardware, software, firmware, or a combination thereof. In example embodiments, the logic is implemented in software or firmware that is stored in a memory and that is executed by a suitable instruction execution system. If implemented in hardware, as in an alternative embodiment, the logic can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In addition, the scope of the present disclosure includes embodying the functionality of the example embodiments disclosed herein in logic embodied in hardware or software-configured mediums.

Software embodiments, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, or communicate the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: a portable computer diskette (magnetic), a random access memory (RAM) (electronic), a read-only memory (ROM)

(electronic), an erasable programmable read-only memory (EPROM or Flash memory) (electronic), and a portable compact disc read-only memory (CDROM) (optical). In addition, the scope of the present disclosure includes embodying the functionality of the example embodiments of the present disclosure in logic embodied in hardware or software-configured mediums.

Although the present disclosure has been described in detail, it should be understood that various changes, substitutions and alterations can be made thereto without departing from the spirit and scope of the invention as defined by the appended claims.

The invention claimed is:

1. A method of determining input power and current comprising:
    providing a power factor correction (PFC) control device having a plurality of analog to digital converter (ADC) inputs and a pulse width modulation (PWM) output controlling an output voltage of the PFC circuit;
    determining power factor correction (PFC) input current utilizing at least one of the ADC inputs of a PFC control device;
    determining PFC input voltage utilizing at least one of the ADC inputs of the PFC control device;
    correlating the PFC input voltage and the PFC input current such that the PFC input voltage and the PFC input current are sampled substantially simultaneously;
    adjusting the determined PFC input current value to compensate for a phase shift in a current sense circuit to determine an adjusted input current;
    determining the input power using the correlated PFC input voltage and the adjusted input current; and
    adjusting the determined input current to compensate for reactive current in an electromagnetic interference (EMI) filter to determine a total input current, wherein the total input current is substantially equal to a square root of a sum of a square of an EMI reactive current and a square of the determined input current, the EMI reactive current substantially equal to the input voltage divided by $1/(2\pi fC)$, where C is an EMI capacitance value and f is the frequency of the input current.

2. The method of claim 1, further comprising calibrating the determined input current for gain and offset in operational amplifiers in a current measurement circuit.

3. The method of claim 2, wherein the calibrating is performed using at most two calibration points.

4. The method of claim 1, wherein the correlating of the PFC input voltage and PFC input current comprises using a dual sample and hold circuit to sample the PFC input voltage and PFC input current substantially simultaneously.

5. The method of claim 1, wherein compensating for a phase shift in the current sense circuit comprises determining a delay of the current sense signal through the current sense circuit.

6. The method of claim 1, wherein the calculating of the input power comprises calculating $$P = \frac{\sum (k_v C_v(n) - m_v)(k_i C_i(n) - m_i)}{N},$$

where $k_v$ is a voltage sense gain, $C_v$ is a voltage ADC conversion output (in counts), $m_v$ is a voltage sense offset, $k_i$ is a current sense gain, $C_i$ is a current ADC conversion output (in counts), and $m_i$ is current sense offset and wherein n is an integer representing the nth sample and N is the total number of samples in an AC cycle.

7. A system of input power and current measurement, comprising:
    a power factor correction (PFC) control device comprising:
        a plurality of analog to digital converter (ADC) inputs and a pulse width modulation (PWM) output, a first at least one of the plurality of ADC inputs configured for sensing an input voltage, a second at least one of the plurality of ADC inputs configured for sensing an input current, the PWM output configured to control an output voltage of a PFC circuit;
        an input voltage signal conditioning circuit configured to receive an input voltage and adjust the input voltage range to fit within the measurement range of the first of the plurality of ADC inputs; and
        a current sense signal conditioning circuit configured to sense an input current of the PFC control circuit and adjust a signal representing the sensed input current to fit within a measurement range of the second at least one of the plurality of ADC inputs,
        the PFC control device configured to determine an input current and adjust the determined input current to compensate for reactive current in an electromagnetic filter to determine a total input current and to compensate for a phase shift introduced by the current sense conditioning circuit, wherein the PFC control device determines the total input current as substantially equal to a square root of a sum of a square of an EMI reactive current and a square of the determined input current, the EMI reactive current substantially equal to the input voltage divided by $1/(2\pi fC)$, where C is an EMI capacitance value and f is the frequency of the input current.

8. The system of claim 7, wherein the PFC control device calibrates the determined input current for gain and offset errors in operational amplifiers in the current sense signal conditioning module.

9. The system of claim 8, wherein the PFC control device calibrates using at most two calibration points.

10. The system of claim 7, wherein the PFC control circuit is further configured to correlate the input voltage and the input current such that the input voltage and the input current are sampled substantially simultaneously.

11. The system of claim 10, wherein the correlating of the input voltage and input current comprises using a dual sample and hold circuit to sample the input voltage and input current substantially simultaneously.

12. A system of input power and current measurement, comprising:
    a power factor correction (PFC) control device comprising:
        a plurality of analog to digital converter (ADC) inputs and a pulse width modulation (PWM) output, a first at least one of the plurality of ADC inputs configured for sensing an input voltage, a second at least one of the plurality of ADC inputs configured for sensing an input current, the PWM output configured to control an output voltage of a PFC circuit;
        an input voltage signal conditioning module circuit configured to receive an input voltage and adjust the input voltage range to fit within the measurement range of the first of the plurality of ADC inputs; and
        a current sense signal conditioning module circuit configured to sense an input current of the PFC control circuit and adjust a signal representing the sensed input current to fit within a measurement range of the second at least one of the plurality of ADC inputs, the PFC control device configured to determine an input current and adjust the determined input current to compensate for reactive current in an electromagnetic filter to determine a total input current and to compensate for a phase shift introduced by the current sense conditioning circuit wherein the PFC control device compensates for a phase shift introduced by the current sense conditioning module by determining a delay of the sensed input current signal through the current sense signal conditioning module.

13. The system of claim 8 wherein the PFC control device calculates the input power as $$P = \frac{\sum (k_v C_v(n) - m_v)(k_i C_i(n) - m_i)}{N},$$

where $k_v$ is a voltage sense gain, $C_v$ is a voltage ADC conversion output (in counts), $m_v$ is a voltage sense offset, $k_i$ is a current sense gain, $C_i$ is a current ADC conversion output (in counts), and $m_i$ is current sense offset and wherein n is an integer representing the nth sample and N is the total number of samples in an AC cycle.

14. The system of claim 13, wherein the PFC control circuit is further configured to correlate the input voltage and the input current such that the input voltage and the input current are sampled substantially simultaneously.

15. A system of input power and current measurement, comprising:
a plurality of analog to digital converter (ADC) inputs, a first at least one of the plurality of ADC inputs configured for sensing an input voltage, a second at least one of the plurality of ADC inputs configured for sensing an input current;
an input voltage signal conditioning module configured to receive an input voltage and adjust the input voltage range for the measurement range of the first of the plurality of ADC inputs;
a current sense signal conditioning module configured to sense an input current and adjust a signal representing the sensed input current to fit within a measurement range of the second at least one of the plurality of ADC inputs; and
a PFC control device configured to determine an input current and adjust the determined input current to compensate for reactive current in an electromagnetic filter to determine a total input current and to compensate for a phase shift introduced by the current sense conditioning circuit, wherein the PFC control device determines the total input current as substantially equal to a square root of a sum of a square of an EMI reactive current and a square of the determined input current, the EMI reactive current substantially equal to the input voltage divided by $1/(2\pi fC)$, where C is an EMI capacitance value and f is the frequency of the input current.

16. The system of claim 15, wherein the PFC control device calibrates the determined input current for gain and offset errors in operational amplifiers in the current sense signal conditioning module.

17. A system of input power and current measurement, comprising:
a plurality of analog to digital converter (ADC) inputs, a first at least one of the plurality of ADC inputs configured for sensing an input voltage, a second at least one of the plurality of ADC inputs configured for sensing an input current;
an input voltage signal conditioning module configured to receive an input voltage and adjust the input voltage range for the measurement range of the first of the plurality of ADC inputs;
a current sense signal conditioning module configured to sense an input current and adjust a signal representing the sensed input current to fit within a measurement range of the second at least one of the plurality of ADC inputs; and
a PFC control device configured to determine an input current and adjust the determined input current to compensate for reactive current in an electromagnetic filter to determine a total input current and to compensate for a phase shift introduced by the current sense conditioning circuit, wherein the PFC control device calculates the input power as $$P = \frac{\sum (k_v C_v(n) - m_v)(k_i C_i(n) - m_i)}{N},$$

where $k_v$ is a voltage sense gain, $C_v$ is a voltage ADC conversion output (in counts), $m_v$ is a voltage sense offset, $k_i$ is a current sense gain, $C_i$ is a current ADC conversion output (in counts), and $m_i$ is current sense offset and wherein n is an integer representing the nth sample and N is the total number of samples in an AC cycle.

* * * * *